United States Patent [19]

Simmons

[11] Patent Number: 4,720,738

[45] Date of Patent: Jan. 19, 1988

[54] FOCAL PLANE ARRAY STRUCTURE INCLUDING A SIGNAL PROCESSING SYSTEM

[75] Inventor: Arturo Simmons, Garland, Tex.

[73] Assignee: Texas Instruments Incorporated, Dallas, Tex.

[21] Appl. No.: 898,890

[22] Filed: Aug. 21, 1986

Related U.S. Application Data

[63] Continuation of Ser. No. 767,062, Aug. 19, 1985, abandoned, which is a continuation of Ser. No. 416,396, Sep. 8, 1982, abandoned.

[51] Int. Cl.$^4$ ............................................. H01L 27/14
[52] U.S. Cl. ........................................ 357/30; 357/32; 357/68; 357/55; 357/40
[58] Field of Search ................ 357/30, 45, 40, 30 B, 357/30 G, 30 H, 30 I, 30 J, 61, 68, 31, 32, 55, 30 R, 30 D, 30 E, 30 P

[56] References Cited

U.S. PATENT DOCUMENTS

| | | | |
|---|---|---|---|
| 3,564,358 | 2/1971 | Hähnlein | 357/49 |
| 3,648,131 | 3/1972 | Stuby | 357/68 X |
| 4,104,674 | 8/1978 | Lorenze, Jr. et al. | 357/30 D |
| 4,381,602 | 5/1983 | McIver | 357/80 X |
| 4,449,044 | 5/1984 | Rotolante et al. | 357/32 X |
| 4,460,915 | 7/1984 | Engel | 357/30 X |
| 4,507,674 | 3/1985 | Gaalema | 357/30 |
| 4,521,798 | 6/1985 | Baker | 357/30 |
| 4,547,792 | 10/1985 | Sclar | 357/30 D X |
| 4,566,024 | 1/1986 | Fleury et al. | 357/31 X |
| 4,570,329 | 2/1986 | Paine et al. | 357/30 X |

FOREIGN PATENT DOCUMENTS

| | | | |
|---|---|---|---|
| 55-68684 | 5/1980 | Japan | 357/30 H |
| 55-83819 | 1/1982 | Japan | 357/68 |
| 57-73984 | 5/1982 | Japan | 357/30 B |
| 2100927 | 1/1983 | United Kingdom | 357/30 B |
| 0152258 | 1/1962 | U.S.S.R. | 357/32 |

OTHER PUBLICATIONS

Itoh et al., "HgCdTe Photoconductive Detector Array," *Fujitsu Sci. & Tech. J.*, (Japan), vol. 16, No. 3, Sep. 1980, pp. 151–165.

Kuhn et al., "Solder Bonding of Silicon Chips with Through Holes," *IBM Tech. Discl. Bull.*, vol. 18, No. 10, Mar. 1976, p. 3478.

Bodendorf et al., "Active Silicon Chip Carrier," *IBM Technical Disclosure Bulletin*, vol. 15, No. 2, (Jul. 1972), pp. 656–657.

*Primary Examiner*—Andrew J. James
*Assistant Examiner*—William A. Mintel
*Attorney, Agent, or Firm*—Carlton H. Hoel; Leo N. Heiting; Melvin Sharp

[57] ABSTRACT

A structure for a focal plane array substrate is disclosed that includes a focal plane array positioned above a semiconductor substrate containing a signal processor. The signal processor is connected to the image detection elements of the focal plane array by connections through the focal plane array chip itself. A method for interconnecting an image array to a signal processor located beneath the image array is also disclosed. This method includes forming holes in the imager array and forming buses connecting the imager array elements to conductors located in the holes that extend to bonding pads connected to the signal processor located below.

4 Claims, 5 Drawing Figures

FOCAL PLANE ARRAY STRUCTURE INCLUDING A SIGNAL PROCESSING SYSTEM

RELATED CASES

This application is a continuation of application Ser. No. 06/767,062, filed Aug. 19, 1985, now abandoned, which is a continuation of application Ser. No. 06/416,396, filed Sept. 8, 1982, now abandoned.

The following applications are related to the present application: U.S. patent application Ser. No. 384,453 entitled "Solid State Multiprobe Testing Apparatus", U.S. patent application Ser. No. 384,454 entitled "Solid State Interconnection System for Three Dimensional Integrated Circuit Structures; U.S. patent application Ser. No. 384,378 entitled "Interconnection of Surfaces For Semiconductor Devices", U.S. patent application Ser. No. 384,451 entitled "Solid State Three Dimensional Semiconductor Interconnect Structure Using Orientation Dependent Etching and Thermal Migration", and U.S. patent application Ser. No. 415,787 entitled "Method Structure For Packaging Focal Plane Array Images and Signal Processing Circuits".

BACKGROUND

1. Field of the Invention

This invention relates to an interconnection structure for image arrays and more particularly to an interconnection structure for a mercury cadmium telluride image array interconnected to a silicon signal processor.

2. Description of Prior Art

Current methods for connection of mercury cadmium telluride focal plane arrays to a silicon signal processor chip include bonding of gold wire to an indium pad on a zinc sulfide layer on the detector array to a pad on a chip carrier which contains the silicon processor chip, and then bonding a gold wire from a pad on the processor chip to the pad already containing the wire from the detector array. This method of interconnection has significant disadvantages such as the large number of connections that need to be made. In addition, ball bonding on the zinc sulfide insulator is very delicate and can cause leaky electrodes if not done properly. Bonding on the indium over zinc sulfide requires a low temperature capillary which is used with light pressure, whereas the bonding on metal over ceramic requires a higher temperature and more pressure at closer tolerances. Due to these problems, the yield and reliability of the devices in combination is not high.

Methods for fabricating such imaging array devices are described in U.S. Pat. No. 4,231,149 entitled Narrow Band Gap Semiconductor CCD Imaging Device and Method of Fabrication assigned to Texas Instruments. This patent describes the fabrication of the image array itself.

It is the object of present invention to provide a method for interconnecting a focal plane array without the use of metal wire. It is another object of the present invention to provide a structure including a focal plane array located above a signal processor.

SUMMARY OF THE INVENTION

An imager structure is disclosed that includes several imaging devices arranged in an array and located on a chip. The chip is located above a silicon substrate containing an electrical circuit. The imager chip includes openings that are located above bonding pads on the silicon substrate. The bonding pads are interconnected to the electrical circuit on the substrate. The imaging devices are selectively connected to electrical buses that connect to conductors located in these holes and form a connection from the imaging devices on the imager chip to the electrical circuitry fabricated below on silicon substrate.

In a preferred embodiment of this invention an imager array of mercury cadmium telluride is fabricated with imager devices in an array form located on the surface of the chip. The chip contains holes located along the edge border of the chip. These holes are located directly over bonding pads of a silicon chip located beneath the imager substrate. The silicon contains electrical circuitry such as a signal processor. The image devices on the image array are connected to aluminum buses that are connected to conductors that occupy the holes near the edge of the imager array and connect the image devices to the signal processor and electrical circuitry located on the silicon substrate below.

The method for forming the imager array over the processors chip is described. The H$_g$CdTe slice is first attached with a thin epoxy layer to a silicon processor chip. After thinning the H$_g$CdTe chip, the holes in the imager array are then formed using an alignment region on the silicon for registration. The imager array is then fabricated using various combinations of insulators and metals. Finally the necessary gates on the imager array are connected by thick metal through the holes in the imager array chip and epoxy to the relevant metalized areas on the silicon process chip.

BRIEF DESCRIPTION OF THE DRAWINGS

The novel features believed characteristic of this invention are set forth in the appended claims. The invention itself, however, as well as other features and advantages thereof will be best understood by reference to the detailed description which follows in conjunction with the accompanying drawings:

DESCRIPTION OF THE PREFERRED EMBODIMENTS

Figure 1:
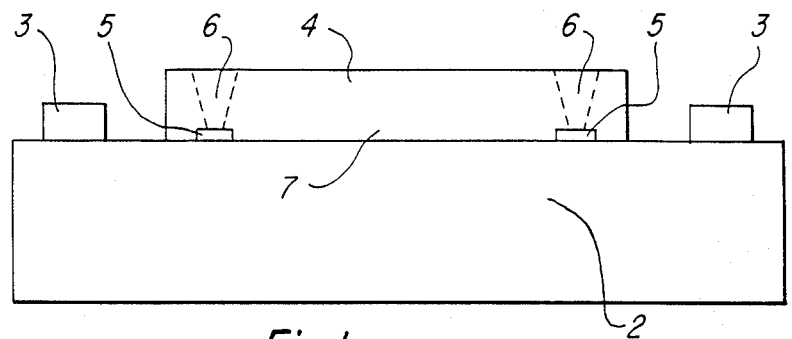
FIG. 1 is a cross-sectional view of an image array structure according to the present invention.

FIG. 1 illustrates a cross-sectional view of a package including a silicon chip 2 supporting a mercury cadmium telluride (HgCdTe) detector array 4. The detector array 4 is aligned over the signal processor implemented on silicon 2. The detector array 4 is physically bonded to the silicon area by an adhesive layer 7 which is typically a low viscosity epoxy. Areas 6 are etched into the mercury cadmium telluride 4 to expose openings to bonding areas 5 on the silicon processor chip 2. The openings 6 are then bonded to the remainder of the array 4 to provide an electrical connection between the image detecting elements in the array 4 and the signal interfaces on bonding pads 5 for the signal processor 2. Bonding areas 3 are provided on the substrate to provide for external bonding to the package.

Figure 2:
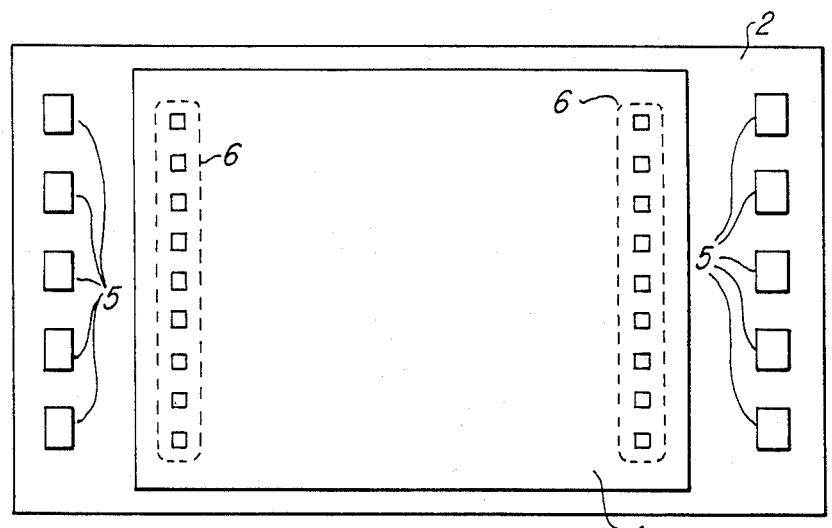
FIG. 2 is a top view of the image array structure in FIG. 1.

FIG. 2 illustrates a top view of the detector array structure. The via areas 6 are shown that will provide the interconnection between the image detecting elements of the image array 4 and the signal processor located below. Bonding areas 5 located on the extremities of the silicon chip 2 are also illustrated for connecting the signal processor under the array 4 to external devices. The via areas 6 are shown that will provide the interconnection between the image detecting elements of the image array 4 and the signal processor located below. Bonding area 5 are also illustrated for connecting the package to external devices.

Figure 3:
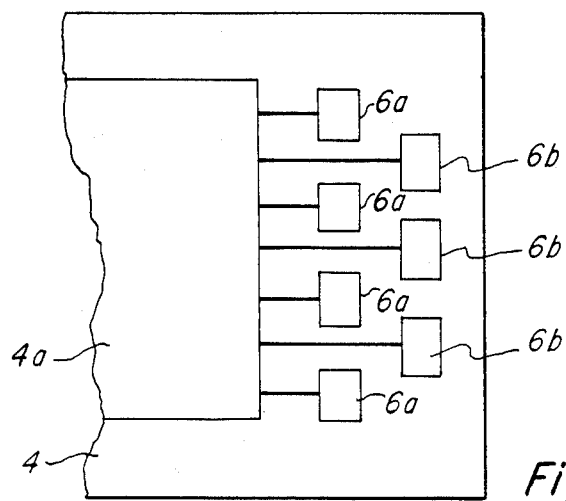
FIG. 3 is a top view of an alternative arrangement of via connections for the image array.

FIG. 3 illustrates a further embodiment showing the interlaced placement of the via areas 6 into two columns of areas 6a and 6b. This interlacing structure connecting the elements in the image array 4 to the silicon processor below allows for an increased number of vias to be placed along the borders of the array 4.

Figure 4:
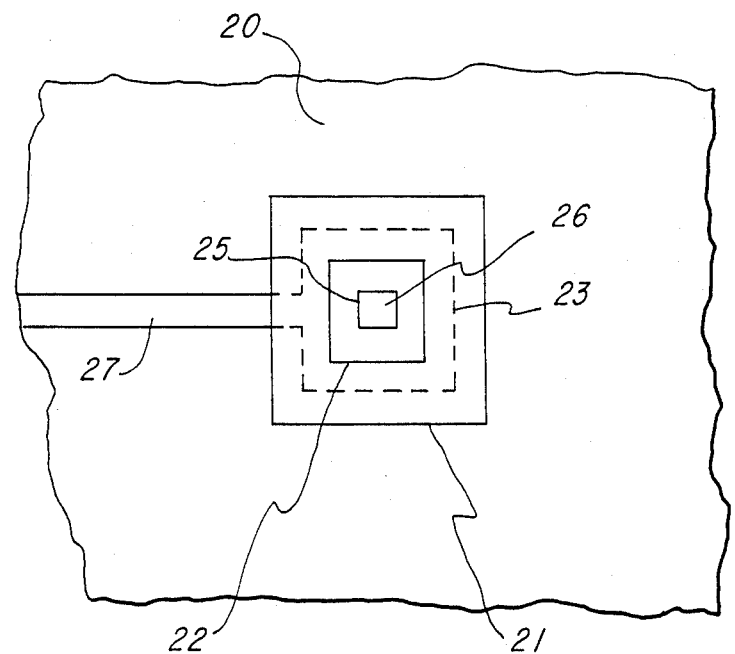
FIG. 4 is a top view of the via structure.

FIG. 4 illustrates a top level view of a single via area of the mercury cadmium telluride detector array. The surface area of the detector array 20 has an opening 22 that is approximately 25 microns square. This opening 22 would expose the epoxy beneath the mercury cadmium telluride data array for connecting this array to the signal processor located below. A further opening 25 is located in the center of the first opening 22 and is approximately 15 microns square and exposes the actual bonding pad 26 that is located on the silicon containing the signal processor. Next, the infrared detector array is fabricated. During this process, several layers of insulator, preferably Zns, totalling approximately 1 micron are deposited in the $H_gCdTe$ chip surface 20 and in the $H_gCdTe$ opening 22 over the epoxy. After all the insulating layers have been deposited, an opening 25 of approximately 10 micron square is etched through the deposited insulator and epoxy to the metal pad 26 on the silicon. An aluminum layer 23 is then deposited on top of the insulating layer contacting the bonding pad 26. This aluminum layer 23 extends into a bus line 27 that is electrically connected to the image array elements on the mercury cadmium telluride surface. Subsequently, a layer of indium 21 is deposited over the aluminum area 23.

Figure 5:
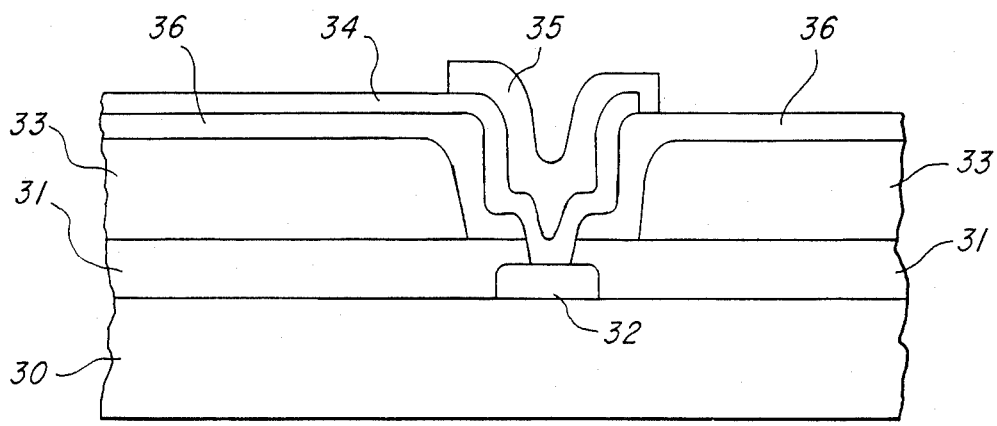
FIG. 5 is a cross-sectional view of the via structure.

FIG. 5 illustrate a cross-sectional area of the structure illustrated in FIG. 4. Referring to FIG. 5, the silicon area 30 contains a bonding pad 32 that connects the detector elements of the mercury cadmium telluride array to the signal processor located on the silicon 30. The epoxy layer 31 is located between the mercury cadmium telluride layer 33 and the silicon layer 30 as before. In addition, an insulating layer of zinc sulfide 36 is shown insulating the mercury cadmium telluride array 33 from the aluminum bus 34. The layer of indium 35 is located over the aluminum bus connection to the bonding pad 32.

The process to form the structure includes first a step that includes the parallel lap and polishing of the back of a surface of a mercury cadmium telluride chip. The back of the surface is then oxidized or otherwise treated to minimize minority carrier recombination. A signal processor implemented on a single semiconductor substrate is fabricated to include the bonding pads interconnects to interconnect the signal processor to the image detection elements on the mercury cadmium telluride array. Epoxy is applied to the processor chip array. In the preferred embodiment, a low viscosity epoxy is used with some degree of pressure to uniformly cure the epoxy to a thickness of 1 micrometer or less. The mercury cadmium telluride chip is then placed on the epoxy and lapped and polished to a final thickness of between 10 and 40 micrometers. The width of the mercury cadmium telluride substrate is then defined to expose external bonding pads on the silicon. Photoresist on the mercury cadmium telluride array may be exposed to protect the array itself from removal. The unwanted portions of the mercury cadmium telluride array may be removed by either milling or dipping the structure in an etchant of bromine and methanol (approximately 1% bromine) at a low temperature (less than 60 degrees C.). Next, openings in the mercury cadmium telluride array must be made down to the epoxy level located directly over the area where the image detector array leads are to be interconnected to the signal processor. These openings may be made with ion milling or with a 1% bromium methanol solution static etch. The bromium methanol will give a nicely tapered edge as it undercuts the photoresist although it will require more surface area than ion milling. The object of this process is to remove the mercury cadmium telluride to the epoxy layer and not to disturb the epoxy layer at this time since the epoxy layer will be later used for zinc sulfide adhesion. The surface of the $H_gCdTe$ is then oxidized. At his point, the infrared detector array is fabricated. This process includes various levels of insulators and metal gates for signal detection, storage, and/or manipulation. These layers of insulator accumulate in the $H_gCdTe$ opening and on the edges of the $H_gCdTe$ openings. This insulating layer is zinc sulfide and is applied to a total thickness of 1 to 1.5 microns. The zinc sulfide will insulate the mercury cadmium telluride edges of the via openings from the interconnection. The insulating layer must cover the step edge of the mercury cadmium telluride adequately. By retaining the area of the epoxy later beneath the step edge of the mercury cadmium telluride layer the epoxy is used to form an adhesion bond to support the insulating layer. A smaller opening in the bottom of the via is now made which will remove the zinc sulfide insulating layer and epoxy to expose the bonding pad to connect to the signal processor. This opening may be made by ion milling (and removal of the ZnS by etchant). A 1,000 Angstrom layer of aluminum is then applied to connect the bonding pads of this signal processor to the detector array. A 12,000 Angstrom Indium bus is then connected to the aluminum applied in the via to the interconnect of the elements contained in the mercury cadmium telluride detector array to the signal processor located on the silicon below.

I claim:

1. An integrated detector array and signal processor, comprising:
   (a) a substantially planar first substrate containing an electrical circuit on one of the planar surfaces thereof;
   (b) a substantially planar second substrate disposed over said one planar surface of said first substrate and containing an array of detectors on the planar surface thereof remote from said first substrate;
   (c) a first electrically insulating layer affixed to the surface of said second substrate opposite said surface containing said array, said second substrate being substantially parallel to, affixed to and insulated from said first substrate by said first electrically insulating layer;
   (d) an aperture having side walls and extending through said second substrate and said first insulating layer;

(e) a second electrically insulating layer disposed over a surface of said second substrate remote from said first substrate and extending along the walls of said aperture; and (f) an electrical connection extending from said surface of said second substrate remote from said first substrate, through said aperture in said first insulating layer and second substrate and insulated from said second substrate by said second insulating layer, to said circuit on said first substrate.

2. The integrated detector array and signal processor of claim 1, wherein:
 said first substrate is substantially silicon; and
 said second substrate is mercury cadmium telluride.

3. The integrated detector array and signal processor of claim 2 wherein said first insulating layer is an epoxy resin.

4. The integrated detector array and signal processor of claim 2 wherein said circuit includes a bonding pad, said electrical connection extending to said pad and being isolated from said second substrate by an infrared transparent electrically insulating layer.

* * * * *